US008560979B2

(12) United States Patent
Wong et al.

(10) Patent No.: US 8,560,979 B2
(45) Date of Patent: Oct. 15, 2013

(54) LOCAL MULTIVARIABLE SOLVER FOR OPTICAL PROXIMITY CORRECTION IN LITHOGRAPHIC PROCESSING METHOD, AND DEVICE MANUFACTURED THEREBY

(75) Inventors: William S. Wong, Ann Arbor, MI (US); Fei Liu, San Jose, CA (US); Been-Der Chen, Milpitas, CA (US); Yen-Wen Lu, Los Altos, CA (US)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 13/541,638

(22) Filed: Jul. 3, 2012

(65) Prior Publication Data

US 2012/0272196 A1 Oct. 25, 2012

Related U.S. Application Data

(63) Continuation of application No. 12/644,790, filed on Dec. 22, 2009, now Pat. No. 8,239,786.

(60) Provisional application No. 61/141,298, filed on Dec. 30, 2008.

(51) Int. Cl.
*G06F 17/50* (2006.01)

(52) U.S. Cl.
USPC .................. 716/53; 716/50; 716/51; 716/52; 716/54; 716/55

(58) Field of Classification Search
USPC .......................................... 716/50, 51, 53, 55
See application file for complete search history.

(56) References Cited

U.S. PATENT DOCUMENTS

| 4,321,688 | A | * | 3/1982 | Sado et al. ............... 708/200 |
| 6,077,310 | A | * | 6/2000 | Yamamoto et al. ........ 716/53 |
| 6,596,444 | B2 | * | 7/2003 | Buck ........................... 430/5 |
| 7,003,758 | B2 | | 2/2006 | Ye et al. |
| 7,707,538 | B2 | | 4/2010 | Wong et al. |
| 7,902,864 | B1 | * | 3/2011 | Hutton et al. ............. 326/39 |
| 8,014,906 | B2 | | 9/2011 | Luo |
| 2002/0076624 | A1 | * | 6/2002 | Buck ........................... 430/5 |
| 2004/0139418 | A1 | * | 7/2004 | Shi et al. ................... 716/19 |
| 2006/0248496 | A1 | * | 11/2006 | Sezginer et al. .......... 716/20 |
| 2008/0309897 | A1 | | 12/2008 | Wong et al. |
| 2009/0091736 | A1 | * | 4/2009 | Yamazoe ................... 355/77 |
| 2009/0299929 | A1 | | 12/2009 | Kozma et al. |
| 2010/0058263 | A1 | * | 3/2010 | Tyminski et al. ........... 716/5 |

OTHER PUBLICATIONS

R. Socha, "Resolution Enhancement Techniques," Photomask Fabrication Technology by Editors Benjamin G. Eynon, Jr. and Banqiu Wu, pp. 466-468 (2005).
A.K. Wong, "Resolution Enhancement Techniques in Optical Lithography," SPIE Press, Chapter 4, pp. 91-115 (2001).
Ye Chen et al. "A Feasible Model-Base OPC Algorithm Using Jacobian Matrix of Intensity Distribution Functions," Optical Microlithography XX, edited by Donis G. Flagello, Proc. Of SPIE, vol. 6502, 65204C (2007).

* cited by examiner

*Primary Examiner* — Vuthe Siek
*Assistant Examiner* — Brian Ngo
(74) *Attorney, Agent, or Firm* — Pillsbury Winthrop Shaw Pittman LLP

(57) ABSTRACT

A multivariable solver for proximity correction uses a Jacobian matrix to approximate effects of perturbations of segment locations in successive iterations of a design loop. The problem is formulated as a constrained minimization problem with box, linear equality, and linear inequality constraints. To improve computational efficiency, non-local interactions are ignored, which results in a sparse Jacobian matrix.

15 Claims, 5 Drawing Sheets

LOCAL MULTIVARIABLE SOLVER FOR OPTICAL PROXIMITY CORRECTION IN LITHOGRAPHIC PROCESSING METHOD, AND DEVICE MANUFACTURED THEREBY

CROSS-REFERENCE TO RELATED APPLICATIONS

This application is a continuation of U.S. application Ser. No. 12/644,790, filed Dec. 22, 2009, now U.S. Pat. No. 8,239,786, which claims priority to U.S. Provisional Application No. 61/141,298, filed Dec. 30, 2008.

BACKGROUND OF THE INVENTION

1. Field of the Invention

The present invention relates generally to resolution enhancement techniques for photolithography and more particularly to techniques for optical proximity correction.

2. Description of the Related Art

A lithographic apparatus is a machine that applies a desired pattern onto a target portion of a substrate. The apparatus generally comprises a radiation system for supplying a beam of radiation, a support structure for supporting a patterning device, the patterning device serving to pattern the beam, a substrate table for holding a substrate, and a projection system for projecting the patterned beam of radiation onto a target portion of the substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion at once, and so-called scanners, in which each target portion is irradiated by scanning the pattern through the projection beam in a given direction (the "scanning"-direction) while synchronously scanning the substrate parallel or anti-parallel to this direction.

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system." The radiation system may also include components operating according to any of these design types for directing, shaping or controlling the projection beam of radiation, and such components. The radiation system as well as the projection system generally comprise components for directing, shaping or controlling the projection beam of radiation. Generally, the projection system comprises means to set the numerical aperture (commonly referred to as the "NA") of the projection system. For example, an adjustable NA-diaphragm can be present in a pupil of the projection system. The radiation system typically comprises adjusting means for setting the outer and/or inner radial extent (commonly referred to as σ-outer and σ-inner, respectively) of the intensity distribution upstream of the mask (in a pupil of the radiation system).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure. The lithographic apparatus may also be of a type wherein the substrate is immersed in a liquid having a relatively high refractive index, e.g., water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

A circuit pattern corresponding to an individual layer of an IC device generally comprises a plurality of device patterns and interconnecting lines. Device patterns may comprise features of different spatial arrangement such as, for example, line-space patterns ("bar patterns"), capacitor contact patterns, patterns of contact holes and DRAM isolation patterns. A feature is not necessarily characterized by a shape whose line elements define a closed contour. For example, a spatial arrangement of extremities of two neighboring features and a space between the two extremities may also, in the context of the present text and claims, be referred to as a feature.

In the context of the present text and claims, sizes of features are referred to as those sizes that the features nominally have at substrate level. At a mask, the size of a feature is M times larger than the nominal size, where M is the magnification of the projection system (typically, $|M|=\frac{1}{4}$ or $\frac{1}{5}$). Generally, additional size deviations at the mask are introduced to compensate for errors occurring, for example, during projection and exposure of a pattern; such a re-sizing of features of the sub-pattern is referred to hereinafter as biasing and/or Optical Proximity Correction ("OPC"). An amount of biasing and/or OPC is also commonly expressed in terms of a corresponding, nominal amount of re-sizing at substrate level. The noun "target" when used in expressions such as "target features" is indicating that these features have substantially a nominal size as desired for the device layer.

One form of OPC is selective bias. Given a CD vs. pitch curve, all of the different pitches could be forced to produce the same CD, at least at best focus and exposure, by changing the CD at the mask level. Thus, if a feature prints too small at the wafer level, the mask level feature would be biased to be slightly larger than nominal, and vice versa. Because the pattern transfer process from mask level to wafer level is nonlinear, the amount of bias is not simply the product of the measured CD error at best focus and exposure time and the reduction ratio, but with modeling and experimentation, an appropriate bias can be determined. Selective bias is an incomplete solution to the problem of proximity effects, particularly if it is only applied at the nominal process condition. Even though such bias could, in principle, be applied to give uniform CD vs. pitch curves at best focus and exposure, once the exposure process varies from the nominal condition, each biased pitch curve will tend to respond differently, resulting gin different process windows for the different features. Therefore, the "best" bias to give identical CD vs. pitch may even have a negative impact on the overall process window, reducing rather than enlarging the focus and exposure range within which all of the target features print on the wafer within the desired process tolerance.

Other more complex OPC techniques have been developed for application beyond the one-dimensional bias example above. A two-dimensional proximity effect is line end shortening. Line ends have a tendency to "pull back" from their desired end point location as a function of exposure and focus. In many cases, the degree of end shortening of a long line end can be several times larger than the corresponding line narrowing. This type of line end pull back can result in catastrophic failure of the devices being manufactured if the line end fails to completely cross over the underlying layer it was intended to cover, such as a polysilicon gate layer over a source-drain region. Since this type of pattern is highly sensitive to focus and exposure, simply biasing the line end to be longer than the design length is inadequate because the line at best focus and exposure, or in an underexposed condition, would be excessively long, resulting either in short circuits as the extended line end touches neighboring structures, or unnecessarily large circuit sizes if more space is added between individual features in the circuit. Since one of the key goals of integrated circuit design and manufacturing is to maximize the number of functional elements while minimizing the area required per chip, adding excess spacing is a highly undesirable solution.

Two-dimensional OPC approaches have been developed to help solve the line end pull back problem. Extra structures (or assist features) known as "hammerheads" or "serifs" are routinely added to line ends to effectively anchor them in place and provide reduced pull back over the entire process window. Even at best focus and exposure these extra structures are not clearly resolved and they alter the appearance of the main feature without being fully resolved on their own. Assist features can take on much more aggressive forms than simple hammerheads added to line ends, to the extent the pattern on the mask is no longer simply the desired wafer pattern upsized by the reduction ratio. Assist features such as serifs can be applied to many more cases than simply reducing line end pull back. Inner or outer serifs can be applied to any edge, especially two dimensional edges, to reduce corner rounding or edge extrusions. With enough selective biasing and assist features of all sizes and polarities, the features on the mask bear less and less of a resemblance to the final pattern desired at the wafer level. In general, the mask pattern becomes a pre-distorted version of the wafer-level pattern, where the distortion is intended to counteract or reverse the pattern deformation that will occur during the lithographic process to produce a pattern on the wafer that is as close to the one intended by the designer as possible.

In another OPC technique, instead of appending assist structures such as serifs to a feature, completely independent and non-resolvable assist features are added to the mask. These independent assist features are not intended or desired to print as features on the wafer, but rather are intended to modify the aerial image of a nearby main feature to enhance the printability and process tolerance of that main feature. Often referred to as "scattering bars," this type of sub-resolution assist feature (SRAF) adds yet another layer of complexity to a mask. A simple example of a use of scattering bars is where a regular array of non-resolvable scattering bars is drawn on both sides of an isolated line feature, which has the effect of making the isolated line appear, from an aerial image standpoint, to be more representative of a single line within an array of dense lines, resulting in a process window much closer in focus and exposure tolerance to that of a dense pattern. The common process window between such a decorated isolated feature and a dense pattern will have a larger common tolerance to focus and exposure variations than that of a feature drawn as isolated at the mask level.

Many of these OPC techniques may be used together on a single mask with phase-shifting structures of different phases added in as well for both resolution and process window enhancement. The simple task of biasing a one-dimensional line becomes increasingly complicated as two-dimensional structures must be moved, resized, enhanced with assist features, and possibly phase-shifted without causing any conflict with adjoining features. Due to the extended proximity range of deep sub-wavelength lithography, changes in the type of OPC applied to a feature can have unintended consequences for another feature located within half a micron to a micron. Since there are likely to be many features within this proximity range, the task of optimizing OPC decoration becomes increasingly complex with the addition of more aggressive approaches. Each new feature that is added to a design has an effect on other features, which then must be re-corrected in turn, and the results must be iterated repeatedly to converge to a mask layout where each feature can be printed in the manner in which it was originally intended while at the same time contributing in the proper manner to the aerial images of its neighboring features such that they too are printed within their respective tolerances.

Due to this complexity and mutual interaction between features, OPC technology has become a major field of innovation and many techniques have been widely described on how to "segment" or "dissect" the features into a manageable number of edges for co-optimization, how to prioritize the optimization routines so that the most critical structures are best protected from unintended distortion by nearby OPC assist features on neighboring features, how to resolve phase and placement conflicts between features, how to trade off computational speed versus ultimate convergence of the resulting feature to the desired results, and other details of the full implementation of OPC as a manufacturable technology.

OPC has generally moved from a rule-based to a model-based approach. In model-based OPC, both the effect of the exposure tool on the aerial image and the effect of the resist processing are modeled mathematically. In a model based design process, a pre-OPC layout, an OPC technology file, an optical model, and a resist model are obtained. The OPC technology file describes the types of model based OPC techniques that are to be used, for example linewidth bias corrections, corner rounding corrections, or line end pull back corrections. The optical model describes the illumination and projection optics of the exposure tool. The optical model may also include the effect of imaging into a thin-film resist or the effect of the mask topography. The resist model describes the changes in the resist after being illuminated by the mask pattern in the exposure tool. An etch model may also be used in this type of method. The optical, resist, and etch models can be derived from first principles, determined empirically from experimental data, or a combination of both. The models are usually calibrated at the nominal process condition. See R. Socha, "Resolution Enhancement Techniques," Photomask Fabrication Technology, Benjamin G. Eynon, Jr. and Banqiu Wu, Editors, McGraw-Hill, pp. 466-468, 2005. The pre-OPC layout, the OPC technology file, and the models are all inputs to the model-based OPC software.

The model-based OPC software segments the features in the pre-OPC layout into edge segments and assigns control points to each edge segment. Each feature is segmented prior to applying any OPC techniques because each feature, even identically-shaped features, will be subject to different proximity environments. The control points (or evaluation points) are the locations where CD or edge placement errors (EPE) will be evaluated during the OPC design process. The assignment of the control points is a complex process that depends on the pattern geometry of the pre-OPC layout and the optical model.

The model-based OPC software proceeds by simulating the printed resist image on the wafer by applying the optical model and the resist model to the pre-OPC layout. In general, the simulation is performed at the nominal process condition at which the optical model has been calibrated. The model-based OPC software then generates the contours of the simulated resist image by comparing the simulated resist image values to a selected threshold value. The model-based OPC software then compares the simulated contours with the pre-OPC layout at the control points to determine if the design layout will deliver the desired patterning performance. The comparisons are typically quantified as a CD or an EPE at each control point. The model-based OPC software then determines whether a figure of merit for the contour metric of each edge segment is satisfied. In one embodiment, the figure of merit is satisfied when the total error for the contour metric, e.g., CD or EPE, of each edge segment is minimized. In another embodiment, the figure of merit is satisfied when the total error for the contour metric of each edge segment is below a predetermined threshold. If the figure of merit is satisfied the process ends, but if the figure of merit is not satisfied, the process continues with a new iteration.

If the EPE of the i-th edge segment ($E_i$) is $\Delta E_i$ determined at the control point $CP_i$, the simplest edge correction amount $\Delta C_i$ is a negation of the error: $\Delta C_i = \Delta E_i$. Such a straightforward correction function does not work well for nonlinear processes because changes on the mask are not linearly reflected in the printed resist image. To account for nonlinearities such as the mask error factor (MEF), a slightly more complicated correction function can be used:

$$\Delta C_i = -E_i / MEF \quad (1)$$

In a particular application, the method of calculating the appropriate correction tends to be much more complex, and the correction algorithms can depend on factors such as linewidth error, fabrication process, correction goals, and constraints. See A. K. Wong, Resolution Enhancement Techniques in Optical Lithography, SPIE Press, pp. 91-115, 2001. For example, if it is assumed that there are n edge segments of a feature and one control point for each edge segment, and that the total correction amount for the i-th edge segment is $C_i$, the ultimate goal is to solve for $C_1, C_2, \ldots, C_n$ iteratively, such that the difference between resist image values $RI(CP_i)$ and the predetermined threshold values T at all control points are equal to zero as: $RI(CP_i) - T = 0$ for $i=1, \ldots, n$, where $CP_i$ are the control points. Alternately, one can minimize the function:

$$\sum_{i=1}^{n} [RI(CP_i) - T]^2 \quad (2)$$

Next, at each iteration, the model-based OPC software adjusts the entire edge segment $E_i$ according to the calculated correction amount $\Delta C_i$ for all edge segments to produce a post-OPC layout, such that the simulated resist image contour moves to match the design geometry. Then the model-based OPC software simulates a resist image using the post-OPC layout. The resist image contours and error are then calculated for the simulated resist image produced using the post-OPC layout. The model-based OPC software determines whether the total EP error is minimized or below a certain threshold. The total EP error may be defined as:

$$Error_{total} = \sum_{i=1}^{n} (\Delta E_i)^2 \quad (3)$$

Alternatively, the total EP error can be defined as the maximum EP error of all segments, i.e.:

$$\max\{|\Delta E_i|\}, i=1, \ldots, n \quad (4)$$

because the OPC goal may be set such that all edge placement errors must be below a certain threshold.

A correction amount is determined individually for each edge segment in the mask layout, without taking into account effects from the movements of other edge segments in the layout. As feature size decreases, solving for the correction amount for individual edge segments experiences convergence problems.

A multivariable solver for OPC has been disclosed in U.S. patent application Ser. No. 11/764,128, herein incorporated by reference in its entirety. In the method described, effects on resist image values at a plurality of edge segments of collective movement of edge segments in a mask layout are tracked. Control points and edge segments are defined for a number of contact features. As contact features tend to be relatively small, moving an edge segment affects the resist image value at that edge segment's control point and also affects the resist image values at the control points of other edge segments of the contact feature. For contact features that are placed close together in the layout, moving an edge segment of one contact feature also affects the resist image values at the control points of edge segments in neighboring contact features. Similar effects on resist image values at control points due to movements of neighboring edge segments can be observed in mask layouts for non-contact layers.

In accordance with an embodiment, the layout is first subdivided into patches, which are typically 20 μm×20 μm to 60 μm×60 μm in area, before applying OPC. After OPC has been applied, the patches are combined together to produce the final post-OPC layout. Then, a resist image (RI) is simulated using a design layout (pre-OPC layout). The resist image may be simulated using a photolithography simulation system such as that disclosed in U.S. Pat. No. 7,003,758, the subject matter of which is hereby incorporated by reference in its entirety. Assuming there exist n movable edge segments, the edge segments in the design layout are perturbed (i.e., moved) by a predetermined distance, which is specified by the n×1 vector $\Delta C^0$, to produce a perturbed layout. By convention, vectorial quantities and matrices are denoted by bold-faced characters throughout this document. A resist image is then simulated using the perturbed layout.

A difference between the simulated RI values produced using the design layout and the simulated RI values produced using the perturbed layout are determined for each edge segment. These differences are used to create an initial matrix, $J^0$. The initial matrix is an n×n matrix, where n is the number of edge segments in the layout, which for some masks can be more than a million. The initial matrix is a diagonal matrix in which the i-th diagonal entry, where i=1, . . . , n, is computed as the differences between the simulated RI values of the i-th segment $\Delta RI_i$ divided by the amount of the perturbation of the i-th segment $\Delta C_i^0$. Mathematically, the i-th diagonal entry of $J^0$ is given by:

$$[J^0]_{ii} = \Delta RI_i / \Delta C_i^0 \quad (n)$$

In other words, initially it is assumed that the edge segments do not interact. Changes in each edge segment's RI value are attributed to that edge segment only. As a diagonal matrix, the off-diagonal elements of $J^0$ are identically zero. That is, $[J^0]_{ij}=0$ for $i \neq j$.

As described in U.S. patent application Ser. No. 11/764,128, a correction delta vector is determined based on the pseudo inverse of the matrix. A damping factor is applied to the correction delta vector and edge segments are each moved by the damped correction delta. A simulated resist image is generated using the updated edge segments. Finally, the matrix is updated based on changes in the simulated resist image values and the correction delta. At this point, one iteration is complete. The method may be further iterated for a selected number of iterations, or the resulting layout achieves a figure of merit. As an example, the figure of merit may be satisfied when a sum of edge placement errors is minimized (e.g., by a least squares method) or when such a sum is below a predetermined threshold. If the figure of merit is not achieved, the method is re-iterated. Upon completion, the resulting design may be used to manufacture a mask, or may be used in computer simulations for other process design activities that require a mask pattern as an input.

In this approach, it can occur that a selected number of iterations is insufficient to estimate all the unknowns in the full Jacobian matrix. Also, depending on the geometry of the mask, the solution may fail to converge to a complete solution due to the presence of a local minimum. As a result, alternate approaches may be useful.

SUMMARY OF THE INVENTION

One aspect of embodiments of the present invention provides a method including simulating a photolithography process using a mask layout to produce a first simulated resist image, perturbing each edge segment in the mask layout by a selected amount to produce an initial perturbed layout, simulating the photolithography process using the initial perturbed layout to produce a second simulated resist image, determining a difference resist image value between the first simulated resist image and the second simulated resist image for each edge segment, creating an n×n matrix J such that $\Delta RI=J\Delta C$, where $\Delta RI$ is an n×1 vector of changes in resist image values and $\Delta C$ is an n×1 vector of changes in segment locations, initializing the matrix J using the difference in resist image values divided by the perturbed amount, determining a correction delta vector $\Delta C$ by minimizing $|J\Delta C+RI|^2+\alpha|\Delta C|^2$ subject to constraints imposed on $\Delta C$, wherein the correction delta vector includes a correction delta value for each edge segment and $\alpha$ is a non-negative scalar, perturbing each edge segment in the perturbed layout by the corresponding correction delta value in the correction delta vector $\Delta C$ to create a further perturbed layout, simulating the photolithography process using the further perturbed layout to produce a third simulated resist image, using information from the third simulated resist image and the matrix J to produce an updated matrix J, and updating the correction delta vector $\Delta C$ by minimizing $|J\Delta C+RI|^2+\alpha|\Delta C|^2$ subject to constraints imposed on $\Delta C$, where the updated matrix J is used in the minimization.

Aspects of embodiments of the invention may include a computer-readable medium encoded with computer-executable instructions for performing the foregoing method or for controlling a computing system for performing the foregoing method.

Aspects of embodiments of the invention may include a lithography or litho cell system configured and arranged to be operated in accordance with the foregoing method. Such a system may incorporate, for example, a computer programmed to allow a user to control the device in accordance with the method, or other methods.

Aspects of embodiments of the invention may include a simulation system configured and arranged to be operated in accordance with the foregoing method.

Aspects of embodiments of the invention may include a method for manufacturing a mask in accordance with the foregoing method and including designing a pattern for a mask, in accordance with the foregoing method and writing a pattern for at least one mask in accordance with the determined perturbed layout.

Aspects of embodiments of the invention may include a method of manufacturing a microelectronic device using a pattern derived according to the foregoing method.

Aspects of embodiments of the invention may include a device manufactured in accordance with the foregoing method.

Aspects of embodiments of the invention may include imaging a pattern determined in accordance with the foregoing method.

DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
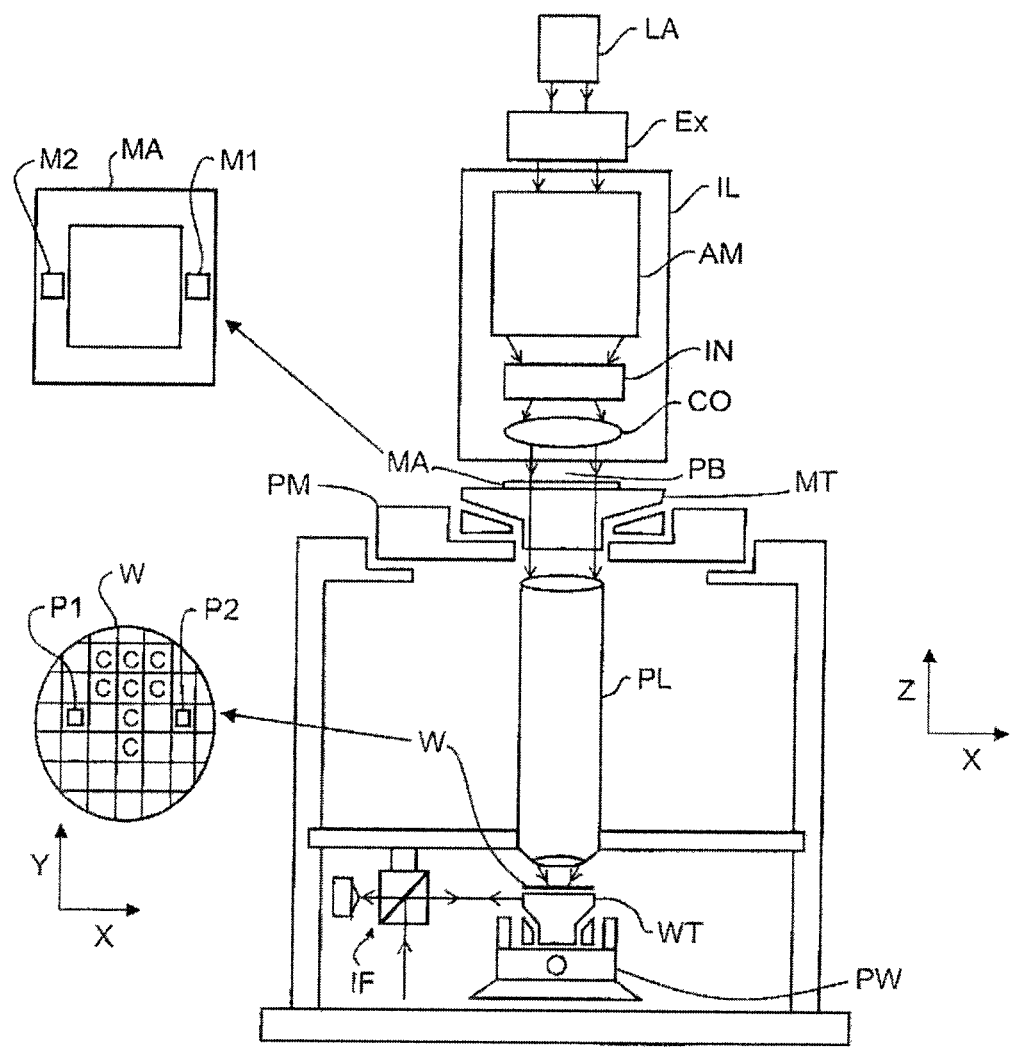
FIG. 1 is a schematic illustration of a photolithography system in accordance with an embodiment of the invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of 365, 248, 193, 157 or 126 nm) and extreme ultra-violet (EUV) radiation (e.g., having a wavelength in the range of 5-20 nm).

The term "patterning device" used herein should be broadly interpreted as referring to devices that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure supports, i.e., bears the weight of, the patterning device. It holds the patterning device in a way depending on the orientation of the patterning device, the design of the lithographic apparatus, and other conditions, such as for example whether or not the patterning device is held in a vacuum environment. The support can be using mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device."

FIG. 1 schematically depicts a lithographic projection apparatus whose processes may be simulated and/or improved in the methods of the invention. The apparatus comprises:

- a radiation system Ex, IL, for supplying a projection beam PB of radiation (e.g., UV radiation or DUV radiation of a wavelength of less than about 270 nm, such as wavelengths of 248, 193, 157, and 126 nm radiation). In this particular case, the radiation system also comprises a radiation source LA;
- a first object table (mask table) MT provided with a mask holder for holding a mask MA (e.g., a reticle);
- a second object table (substrate table) WT provided with a substrate holder for holding a substrate W (e.g., a resist-coated silicon wafer); and
- a projection system ("lens") PL (e.g., a quartz and/or $CaF_2$ lens system or a catadioptric system comprising lens elements made from such materials, either suitable for conventional imaging or suitable for imaging in the presence of an immersion fluid) for imaging an irradiated portion of the mask MA onto a target portion C (e.g., comprising one or more dies) of the substrate W.

As here depicted, the apparatus is of a transmissive type (i.e., has a transmissive mask). However, in general, it may also be of a reflective type, for example (with a reflective mask). Alternatively, the apparatus may employ another kind of patterning device, such as a programmable mirror array of a type as referred to above.

The source LA (e.g., a UV mercury arc lamp, or a DUV excimer laser) produces a beam of radiation. This beam is fed into an illumination system (illuminator) IL, either directly or after having traversed conditioning optics, such as a beam expander Ex, for example. The illuminator IL may comprise adjustable elements AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g., with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of positioner not explicitly depicted in FIG. 1 (and interferometers or linear encoder IF), the substrate table WT can be moved accurately, e.g., so as to position different target portions C in the path of the beam PB. Similarly, additional positioners (not explicitly depicted in FIG. 1) can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:

1. In step mode, the mask table MT is kept essentially stationary, and an entire mask image is projected at once (i.e., a single "flash") onto a target portion C. The substrate table WT is then shifted in the x and/or y directions so that a different target portion C can be irradiated by the beam PB; and 2. In scan mode, essentially the same scenario applies, except that a given target portion C is not exposed in a single "flash." Instead, the mask table MT is movable in a given direction (the so-called "scan direction," e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Mask design, for a lithography system as illustrated in FIG. 1, particularly for imaging at very high resolutions, may require OPC elements in order to properly render the desired features. This is particularly true where device size is smaller than a wavelength of the imaging light. For example, for a modern machine operating at the 32 nm node, the imaging light may still be 193 nm light from an ArF laser.

As noted above, one approach to designing OPC elements for a mask may include tracking effects on resist image values at a plurality of edge segments of collective movement of edge segments in a mask layout as described in U.S. patent application Ser. No. 11/764,128. In order to provide various improvements in functionality, a method in accordance with an embodiment of the present invention computes an n×n Jacobian matrix J such that $$\Delta RI = J \Delta C \qquad \text{(Eqn. 1)}$$

where $\Delta RI$ is an n×1 vector of changes in RI values between successive OPC iterations and $\Delta C$ is an n×1 vector of changes in segment location between successive iterations.

Figure 2:
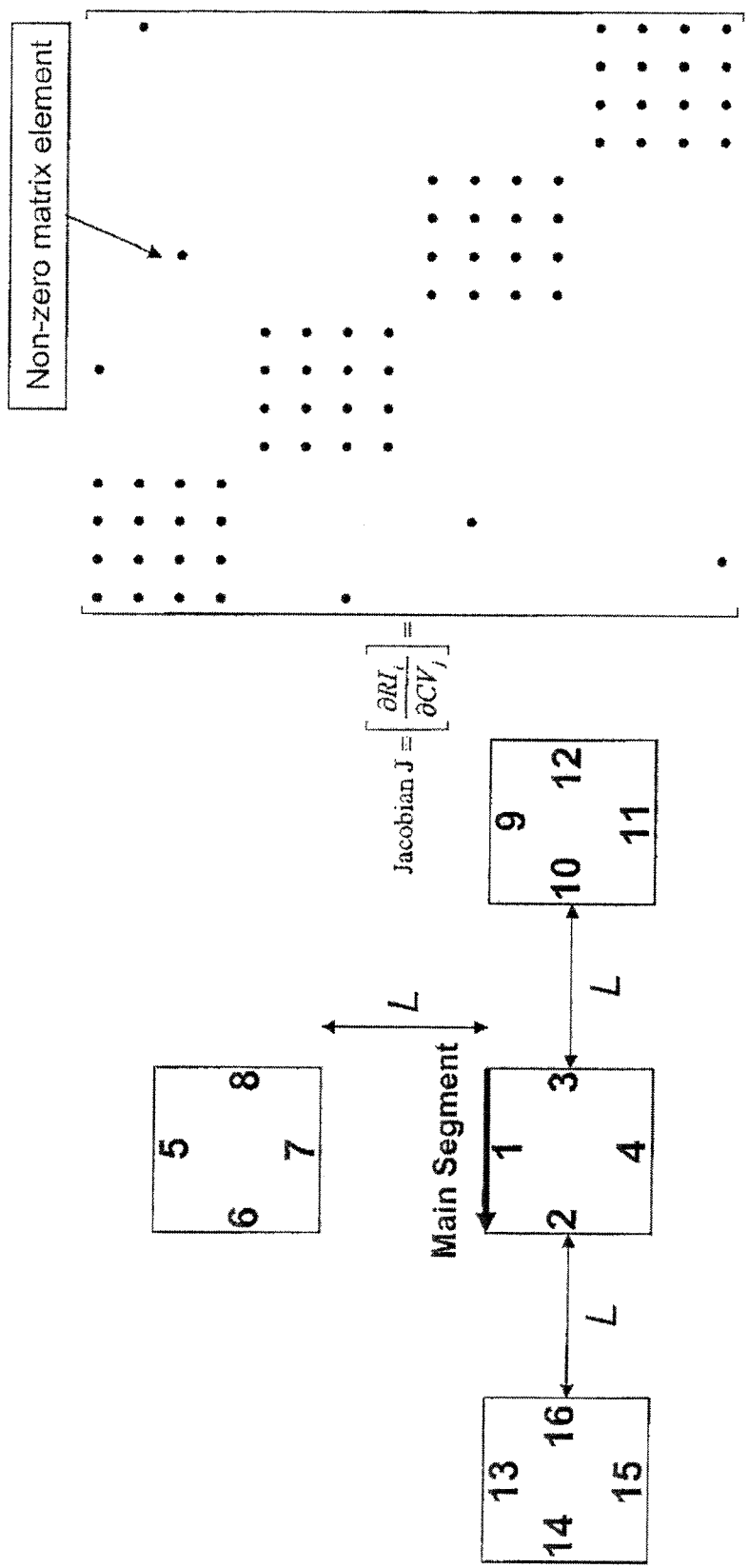
FIG. 2 is an illustration showing segments and control points, along with a sparse matrix representing the interaction between changes at the control points.

FIG. 2 illustrates four contact holes separated by a pitch L and each having respectively numbered edges 1 to 16. For purposes of illustration, the main segment is segment 1 and its nearest neighboring segments are 2, 3, 4, and 7. Also illustrated in FIG. 2 is the sparse matrix J of dimension 16×16, where n=16 in this case.

The matrix J is a possibly sparse, mostly banded matrix as it can be assumed that segments that are physically distant have minimal interactions which may be ignored. As illustrated in FIG. 2, a main segment affects its neighboring segments according to their physical proximity. In the example shown, segments 1 (the main segment), 2, 3, 4 and 7 (the four nearest neighbors) are assumed to be able to change the main segment's RI value if the segments are moved. Therefore, in the first row of the matrix, the elements $\alpha_{11}$, $\alpha_{12}$, $\alpha_{13}$, $\alpha_{14}$, and $\alpha_{17}$ do not equal zero, while the remaining elements in the first row are assumed to be zero.

Assuming that the matrix J is known, the solver determines a correction amount $\Delta C$ for edge segments in the layout at the current OPC iteration by minimizing $$|J\Delta C + RI|^2 + \alpha|\Delta C|^2 = \Delta C^T J^T J \Delta C - 2RI^T J \Delta C + RI^T RI + \alpha \Delta C^T \Delta C \qquad \text{(Eqn. 2)}$$

subject to the constraints i) $\Delta C_{min} \leq \Delta C \leq \Delta C_{max}$ and ii) $A\Delta C = b$, where RI is an n×1 vector of RI values, where the superscript T denotes a matrix transpose, $\Delta C_{min}$ and $\Delta C_{max}$ are n×1 vectors specifying the minimum and the maximum allowable values of $\Delta C$, respectively, A is an r×n matrix and b is an r×1 vector specifying the r equality constraints (e.g., $\Delta C_1 - \Delta C_2 = 0$, $\Delta C_1 - \Delta C_3 = 0$, etc.), and a is a non-negative scalar. When the matrix J is rank-deficient or near rank-deficient, multiple solutions might result as the system becomes underdetermined; in this case, the presence of a prevents the solver from converging to undesirable solutions whose norm $|\Delta C|$ is large. In practice, the values for $\Delta C_{min}$ and $\Delta C_{max}$ may be obtained from the mask design rules or from user specifications and may be on the order of, for example, a few nanometers.

The box constraint on $\Delta C$ (i.e., constraint i), above), implements a trust-region or restricted step method to the solution. In this case, the model (the Jacobian J) is known to be accurate as long as the norm of the solution $|\Delta C|$ stays below a certain value.

The equality condition $A\Delta C = b$ is imposed if it is desirable to have symmetry in the mask. Often, mask patterns for contact holes, for example, will be largely symmetric and this is a valid approach. In an alternate approach, computational performance may be greatly improved through the use of substitution in order to reduce a total number of unknowns. For example, if the original problem is to minimize $x_1^2 + 2x_2^2$ subject to an equality constraint $x_1 = x_2$, then substitution reduces the problem to one of minimizing $3x_1^2$ with no constraints.

Because the system is, in general, nonlinear, the matrix elements $J_{ij}$ are continuously estimated and updated (i.e., at the end of each iteration) in order to improve convergence of the Jacobian. In this regard, Broyden's method or a Kalman filter may be applied.

In an embodiment based on Broyden's method, for iteration k−1 we have $RI^{k-1}$ and $J^{k-1}$. At the following iteration k, the segments move by $\Delta C^k$ and the new values for RI are $RI^k$. Broyden's method updates the matrix based on differences between the observed change in RI values $\Delta RI^k = RI^k - RI^{k-1}$ and the predicted change in RI values, $J\Delta C$:

$$J^k = J^{k-1} + [RI^k - RI^{k-1} - J^{k-1}\Delta C^k](\Delta C^k)^T / |\Delta C^k|^2 \qquad \text{(Eqn. 3)}$$

where the superscript T denotes a matrix transpose.

In the Kalman filter approach, the non-zero entries of the Jacobian matrix are estimated using a Kalman filter based on measurement data $\Delta C$ and $\Delta RI$. The i-th row in Equation 1 at iteration k:

$$\Delta RI_i^k = RI_i^k - RI_i^{k-1} = \Sigma_j J_{ij}^k \Delta C_j^k \qquad \text{(Eqn. 4)}$$

resembles the observation equation used in a Kalman filter, when $\Delta RI_i^k$ is considered to be the observed output, the i-th row of $J^k$ is considered to be the state vector to be estimated, and $(\Delta C^k)^T$ is considered to be the observation-model matrix which maps the state space into the observed space. In other words, the observation equation used in the Kalman filter is $$\Delta RI_i^k = (\Delta C^k)^T (J_{i:}^k)^T + e^k \qquad \text{(Eqn. 5)}$$

where $J_{i:}^k$ denotes the i-th row of the J matrix at iteration k and $e^k$ is a scalar noise term with zero mean and variance $\Sigma_e^k$. The system equation used in the Kalman filter is $$J_{i:}^k = J_{i:}^{k-1} + \epsilon^k \qquad \text{(Eqn. 6)}$$

where $\epsilon^k$ is an n×1 vectorial noise term with zero mean and an n×n covariance matrix $\Sigma_\epsilon^k$. Using the Kalman-filter formulation, the n×1 Kalman gain matrix is computed at iteration k as $$K^k = (P^{k-1} + \Sigma_\epsilon^k)\Delta C^k [(\Delta C^k)^T (P^{k-1} + \Sigma_\epsilon^k)\Delta C^k + \Sigma_e^k]^{-1} \qquad \text{(Eqn. 7)}$$

where $P^{k-1}$ is the n×n covariance matrix for the state vector at iteration k−1. The state vector, i.e., the i-th row of J, is updated at iteration k as $$(J_{i:}^k)^T = (J_{i:}^{k-1})^T + K^k [\Delta RI_i^k - (\Delta C^k)^T (J_{i:}^{k-1})^T] \qquad \text{(Eqn. 8)}$$

Similarly, the covariance matrix for the state vector is updated at iteration k as $$P^k = [I - K^k (\Delta C^k)^T](P^{k-1} + \Sigma_\epsilon^k) \qquad \text{(Eqn. 9)}$$

where I is the n×n identity matrix. In the case that J is sparse, whose i-th row has q≤n non-zero entries, for example, Equations 4 to 9 remain the same but the dimensions of the matrices are reduced. The dimensions of the state vector, its covariance matrix, and the Kalman gain matrix are now q×1, q×q, and q×1, respectively.

The sparsity of the Jacobian J can be varied with the iteration number. For example, at the first few iterations where not too much is learned about the matrix due to limited measurement data, J can be made quite sparse, even diagonal.

Either approach should be useful for converging on a solution to the minimization problem. In practice, it has been shown that each iteration may take approximately 0.1 ms of computing time for n=1000. Experimental results show that 12 iterations can provide good convergence, thus computing time can be about 1 ms. Moreover, even for a much larger number of iterations (e.g., 30), solutions should take only a few ms.

Figure 3:
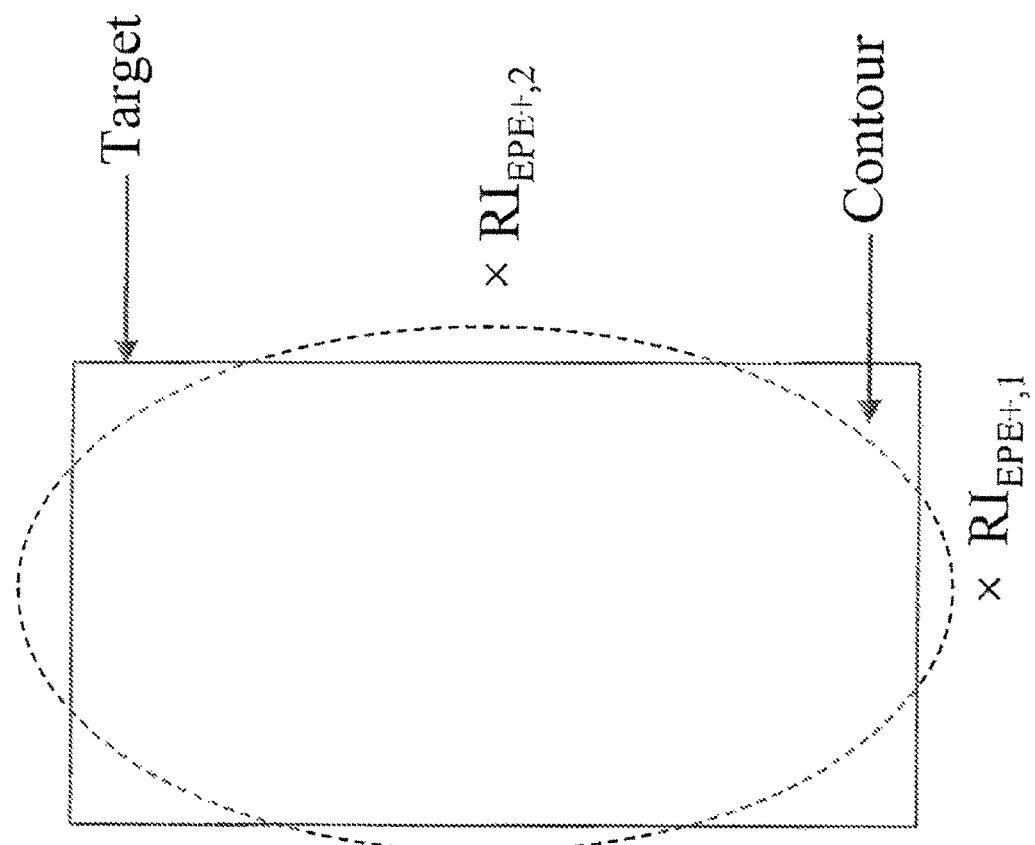
FIG. 3 illustrates a process window constraint in accordance with an embodiment of the present invention.
Figure 4:
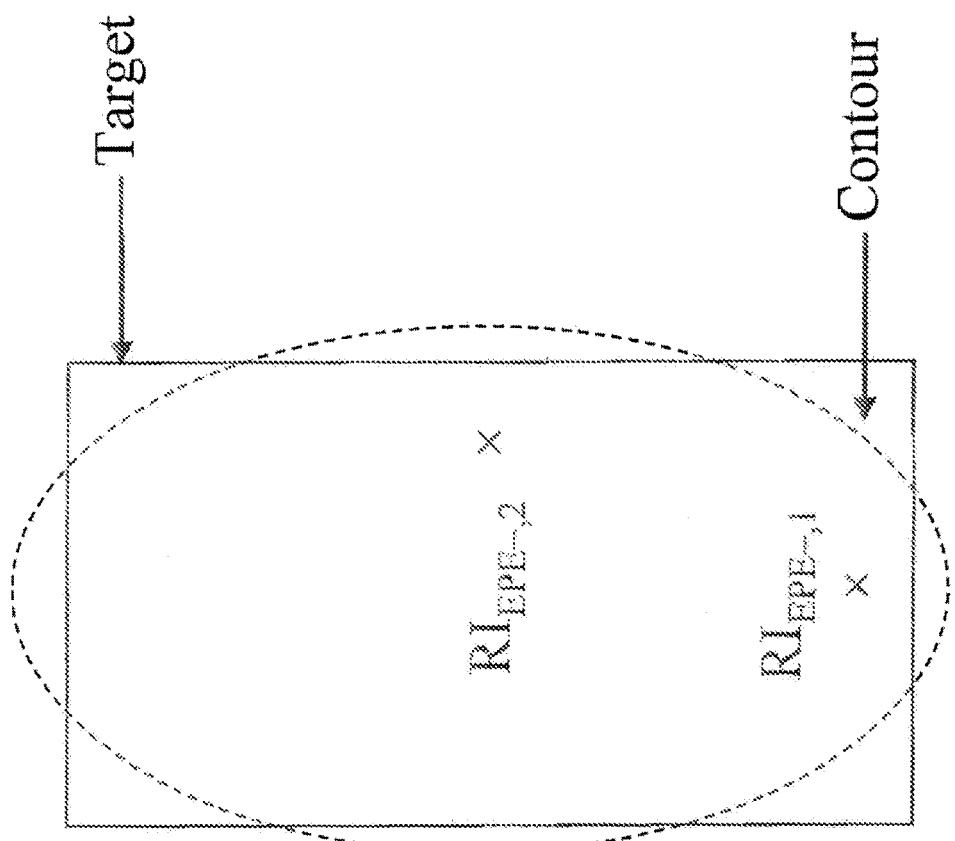
FIG. 4 illustrates a process window constraint in accordance with an embodiment of the present invention.
Figure 5:
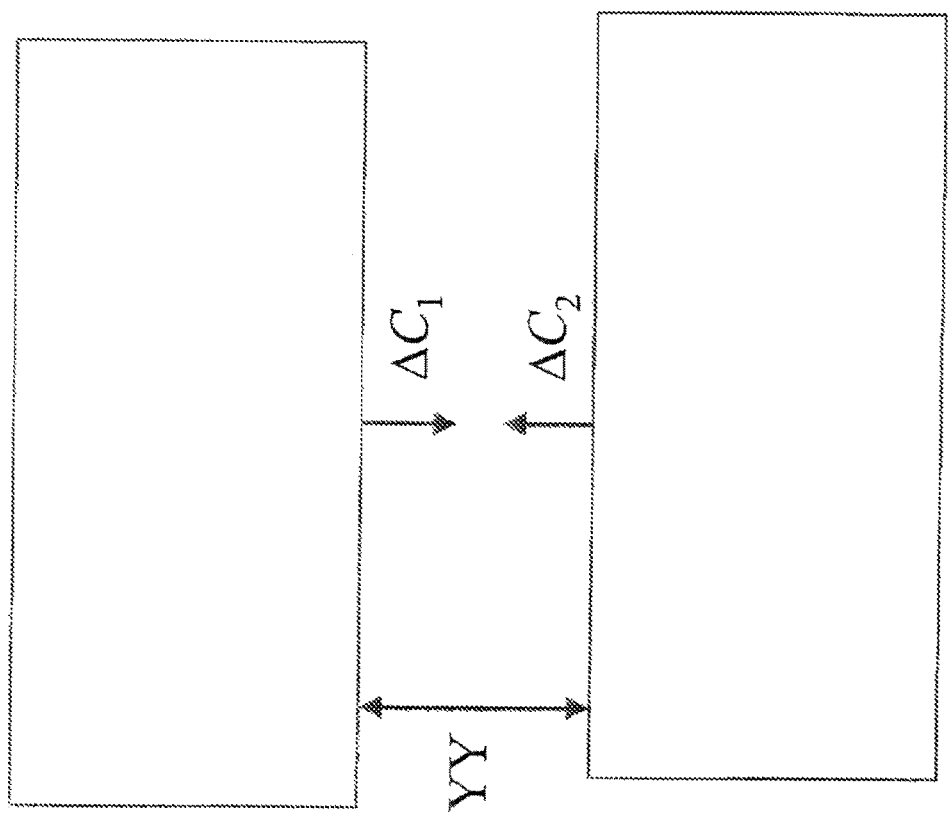
FIG. 5 illustrates a process window constraint in accordance with an embodiment of the present invention.

Additional functionality may be included to allow for additional linear inequality restraints. In particular, process-window constraints may be applied. In FIG. 3, the requirement that the RI contour at one of the process-window conditions must not expand past the points labeled $RI_{EPE+,1}$ and $RI_{EPE+,2}$, which will result in a large positive EPEs, can be stated in as linear inequality constraint: $RI_{EPE+} + J_{PW}\Delta C \leq 0$, where $RI_{EPE+}$ is the n×1 vector of RI values evaluated at the locations $RI_{EPE+,1}$, $RI_{EPE+,2}$, etc., $J_{PW}$ is the n×n Jacobian matrix describing the linear relationship $\Delta RI_{EPE+} = J_{PW}\Delta C$ at the particular process-window condition. Similarly, as shown in FIG. 4, the requirement that the RI contour at one of the process-window conditions must not shrink beyond the points labeled $RI_{EPE-,1}$ and $RI_{EPE-,2}$, which will result in a large negative EPEs, can be stated in as linear inequality constraint: $RI_{EPE-}+J_{PW}\Delta C \geq 0$. In addition, functionality may be included to allow for mask rule constraints (e.g., minimum spacing, maximum widths, etc.) using the inequality constraint $d \leq E\Delta C \leq f$, where d and f are t×1 vectors and E is a t×n matrix specifying the t linear inequalities. For example, as shown in FIG. 5, if the minimum space between the two opposing segments in a mask is minSpace while their original spacing is YY, the inequality becomes $YY-(\Delta C_1+\Delta C_2) >= $minSpace, where $\Delta C_1$ and $\Delta C_2$ are the correction delta values for the two segments.

In accordance with an embodiment of the invention, the method is performed by software modules configured to execute the simulation processes described herein. The software modules can in turn be embodied in machine executable instructions stored on a machine readable medium. Modules can be configured to perform the splitting algorithms and additional modules, either embodied in a common or specialized computing system or embodied in a lithographic apparatus itself, can be configured to operate a lithographic apparatus to perform imaging of devices onto substrates using masks designed in accordance with the methods described herein.

Although the invention has been described in detail for the purpose of illustration based on what is currently considered to be the most practical and preferred embodiments, it is to be understood that such detail is solely for that purpose and that the invention is not limited to the disclosed embodiments, but, on the contrary, is intended to cover modifications and equivalent arrangements that are within the spirit and scope of the appended claims. For example, though reference is made herein to a computer, this may include a general purpose computer, a purpose-built computer, an ASIC programmed to execute the methods, a computer array or network, or other appropriate computing device. As a further example, it is to be understood that the present invention contemplates that, to the extent possible, one or more features of any embodiment can be combined with one or more features of any other embodiment.

What is claimed is:

1. A method implemented by a computer for reducing optical proximity effect in a design layout to be included in a mask used in a lithographic process, the method comprising:
   dividing patterns within the design layout into edge segments;
   identifying a plurality of neighboring edge segments that interact with each other due to the optical proximity effect; and
   computing, by using a computer, an amount of movement of each of the identified neighboring edge segments for reducing the optical proximity effect, the computing including maintaining a plurality of model values that can be used to predict a change in an image value associated with each of the identified neighboring edge segments given a correction amount of movement
   wherein the optimal amount of movement is computed for the identified neighboring edge segments in terms of alteration of image values at predefined locations in the design layout;
   wherein the plurality of model values are arranged in a matrix form, the matrix being used to compute the amount of movement; and
   wherein the matrix comprises a sparse matrix, where matrix elements that represent effects of non-neighboring edge segments are assumed to be zero.

2. The method of claim 1, wherein the image value is a resist image value.

3. The method of claim 1, wherein the computed optimal amount of movement tracks an effect of collective movement of the identified neighboring edge segments.

4. The method of claim 1, wherein computing the movement amount for the edge segments in the design layout includes minimizing an objective function comprising the sparse matrix.

5. The method of claim 4, wherein the minimization is done in an iterative manner.

6. The method of claim 4, wherein the minimization is subject to one or more constraints.

7. The method of claim 6, wherein a maximum and a minimum value of the correction amount are used as constraints.

8. The method of claim 7, wherein one or more of the maximum and the minimum value of the correction amount are determined from mask design rules.

9. The method of claim 7, wherein one or more of the maximum and the minimum value of the correction amount are determined from user specification.

10. The method of claim 7, wherein one or more of the maximum and the minimum value of the correction amount are in the order of nanometers.

11. The method of claim 6, wherein a symmetry in the design layout is used as a constraint.

12. A method implemented by a computer for reducing optical proximity effect in a design layout to be included in a mask used in a lithographic process, the method comprising:
   dividing patterns within the design layout into edge segments;
   identifying a plurality of neighboring edge segments that interact with each other due to the optical proximity effect; and
   computing, by using a computer, an amount of movement of each of the identified neighboring edge segments for reducing the optical proximity effect, wherein the computing considers a combined effect of collective movement of the identified neighboring edge segments on a value of a simulated image characteristic at one or more predefined locations in the design layout, the computing including maintaining a plurality of model values that can be used to predict a change in the value of the simulated image characteristic associated with each of the identified neighboring edge segments given a correction amount of movement
   wherein the optimal amount of movement is computed for the identified neighboring edge segments in terms of alteration of image values at predefined locations in the design layout;
   wherein the plurality of model values are arranged in a matrix form, the matrix being used to compute the amount of movement; and
   wherein the matrix comprises a sparse matrix, where matrix elements that represent effects of non-neighboring edge segments are assumed to be zero.

13. The method of claim 12 wherein the simulated image characteristic is a resist image value.

14. The method of claim 12, wherein computing the movement amount for the edge segments in the design layout includes minimizing an objective function comprising the sparse matrix.

15. The method of claim 14, wherein the minimization is subject to one or more constraints.

* * * * *